United States Patent
Wang

(10) Patent No.: US 10,432,153 B2
(45) Date of Patent: Oct. 1, 2019

(54) BIASING METHOD WITHOUT USING THERMAL COMPENSATION APPLICABLE FOR BOTH CLASS-A AND CLASS-AB AUDIO POWER AMPLIFIER

(71) Applicant: Zhenwu Wang, Moorpark, CA (US)

(72) Inventor: Zhenwu Wang, Moorpark, CA (US)

( * ) Notice: Subject to any disclaimer, the term of this patent is extended or adjusted under 35 U.S.C. 154(b) by 0 days.

(21) Appl. No.: 15/911,164

(22) Filed: Mar. 4, 2018

(65) Prior Publication Data

US 2019/0273474 A1    Sep. 5, 2019

(51) Int. Cl.
*H03F 3/21* (2006.01)
*H03F 1/30* (2006.01)
*H03F 3/45* (2006.01)
*H03F 3/10* (2006.01)

(52) U.S. Cl.
CPC ............. *H03F 3/21* (2013.01); *H03F 1/301* (2013.01); *H03F 1/302* (2013.01); *H03F 3/10* (2013.01); *H03F 3/4508* (2013.01); *H03F 3/45179* (2013.01); *H03F 3/45376* (2013.01)

(58) Field of Classification Search
USPC .................................................. 330/262–276
See application file for complete search history.

(56) References Cited

U.S. PATENT DOCUMENTS 7,368,992 B2 *  5/2008  Sandquist  .............  H03F 1/3217
                                                              330/264

* cited by examiner

*Primary Examiner* — Hieu P Nguyen

(57) ABSTRACT

The present invention reveals a new biasing method which can be used in solid state audio power amplifier design despite of the Class of operation. The proposed biasing technology relies only on traditional electrical feedback to build up and maintain the desired biasing current and doesn't need thermal coupling or thermal tracking techniques in order to overcome power transistor device's temperature dependent input-output characteristics as required by traditional approach. An ingenious current sensing and amplification circuit is devised in order to generate an voltage output which is only corresponding to the quiescent biasing current of the output stage. This voltage output is then used as an representative of the power stage biasing current to be regulated by a feedback loop comprising a traditional voltage multiplier, the output stage and the aforementioned current sensing and amplification circuit.

13 Claims, 4 Drawing Sheets

Fig. 1: Prior Art of Thermo Compensation Based Biasing Technique

Fig. 2: Prior Art: An example of Existing Electrical Feedback Based Biasing Technique

BIASING METHOD WITHOUT USING THERMAL COMPENSATION APPLICABLE FOR BOTH CLASS-A AND CLASS-AB AUDIO POWER AMPLIFIER

In a typical solid state audio power amplifier, the output stage is constructed by a complimentary Emitter Follower (EF, when Bipolar Junction Transistors are used) or Source Follower (SF, when MOSFETs are used) circuits. In some cases a so-called Complimentary Feedback Pair (CFP) or Inverted Darlington circuit is used as well. For all the three circuit constructions, one of the most important design factors is the bias condition or operation class of the devices. Depending on the biasing current as related to output current at full signal swing, the operation class of the output stage (and hence the whole amplifier) can be characterized as Class-A, Class-AB and Class-B. The definition and performance characteristics of each operation class can be found in any textbook on amplifier design and hence will not be addressed in detail hereafter.

Among the three operation classes, the Class-A and Class-AB biasing both need to establish a quiescent biasing current in the output devices (despite of the significant difference of the current value between the two classes) under idling condition while the Class B biasing doesn't. Since the zero quiescent biasing imposes significant cross-over distortion in the amplifier output, pure Class B amplifier is not common in Hi-Fi audio amplifier industry and hence will not be further considered in the following discussion.

The quiescent biasing current is a very important (if not a determinative) factor in audio power amplifier design because its value and stability directly impacts key amplifier performances like distortion (sound quality), cost, weight, dimension, reliability, etc. However, on the other hand, designing a biasing scheme to be able to establish a well defined quiescent current and keep it over varying operation condition including ambient temperature changes is very challenging for solid state output stages constructed with any of the aforementioned circuit architectures as mentions above (i.e., EF, SF and CFP).

The biasing difficulty comes from the temperature dependency of the V-I characteristics of the semiconductor devices used in the output stage. BJT transistors' base-emitter voltage $V_{be}$ has negative temperature correspondence when current is held constant. It implies that the transistor $V_{be}$ will drop if its conducting current is kept constant as its junction temperature increases, or its conduction current will increase if the $V_{be}$ is kept constant while its junction temperature increases. The $V_{be}$ vs. Temperature relationship is characterized as Temperature Coefficient (TC). BJTs typically have −2.2 mV/° C. TC on $V_{be}$ at room temperature. MOSFETs have more complicated temperature dependency as the TC changes with the conducting current, but at typical audio power amplifier operating condition the TC of $V_{gs}$ is negative as well and typically is around −6 mV/° C. at room temperature.

Because of the negative TC of the power transistor device, the biasing voltage has to be able to compensate the $V_{be}$ or $V_{gs}$ variation as temperature changes, otherwise the biasing current will deviate, resulting in performance variation including distortion behavior changes and reliability deterioration.

Traditional solution of this problem is to rely on a thermally-compensated $V_{be}$ multiplier circuit to generate a biasing voltage with desired temperature dependency able to compensate that of the output devices. A typical circuit implementing this technique is illustrated in FIG. 1. The circuit is actually a voltage multiplier because its output voltage, $V_{ce}$, is the multiplied product of its Base Emitter voltage, $V_{be}$, and the scaling factor of $(R_1+R_2)/R_1$ if the transistor base current is kept ignorable. To make the $V_{ce}$ have the desired temperature correspondence to just compensate that of the output power devices, transistor Q1 has to be mounted in the close proximity of one of the output power devices on the heat-sink so that the junction temperature of $Q_1$ will track (supposedly) that of the output device hence $Q_1$'s $V_{be}$ change will be equal to that of the output device, resulting in an up scaled $V_{be}$ voltage on $V_{ce}$. By designing/adjusting the scaling factor of $(R_1+R_2)/R_1$, an ideal condition can be reached that the effective TC of $V_{ce}$ equals to the summed TC of the serially accumulated power transistor $V_{be}$s as seen between the two nodes of $V_{ce}$. Under this situation, the total temperature related $V_{be}$ change of the output transistors will be compensated by the same amount of changes on the biasing voltage $V_{ce}$, resulting in a net constant biasing voltage, as a result a stable biasing current is established despite of temperature variation.

However, in reality such an ideal thermal-electrical compensation condition is very difficult (if not impossible) to achieve, and even if it is accomplished under certain condition the situation is still difficult to maintain as temperature and other operating condition changes, the reasons are explained as below.

First, in order to be able to do quantitative analysis and design of the thermal-electrical behavior of the circuit, thermal related aspects like thermal resistance, thermal capacitance and thermal models of all the devices and components are needed. Furthermore, since the ventilation and air circulation condition of the amplifier also affect the thermal behavior of the amplifier, those aspects need to be taken into account as well. However, in reality, except for very limited parameters like thermal resistance of power transistors, most thermal related quantities and aspects are either not available or difficult (if not impossible) to quantitative, hence accurate thermal modeling and analysis for such a system is almost impossible. Therefore, this thermal-electrical compensation technique in practice usually ends up with relying on mostly cut-and-tries on a prototype built on extremely simplified thermal modeling/calculation.

Second, the thermal conducting path in the compensation loop as described above possesses significant propagation delay due to the big mass of components like heat-sink. The thermal response speed in such a system is usually in the order of minutes or even tens of minutes. Such a long compensation lag could cause significant under-biasing or over-biasing under certain conditions. For example, assuming a music program containing an extended period of highlight followed by low level passage, in this case the biasing voltage generated corresponding to the hot condition of the heat-sink due to the prolonging high-level reproduction will postpone for a substantial period before the heat-sink cools down as the music changes from highlights to low level and continues. Since the junction temperature of the power transistors drops much faster than that of the heat-sink due to the significant mass difference, the transistors will be significantly under-biased before the heat-sink temperature finally catches up the already cooled down transistor junction temperature. Such an under-biasing condition will cause significant cross-over distortion, leading to real music reproduction performance worse than what the product datasheet would suggest as the distortion number of which is obtained under static thermal condition where a sine wave signal with constant amplitude is kept being applied to the amplifier during the measurement.

Third, the ambient temperature plays an important role in the thermal compensation scheme while this parameter is completely out of the control of the designer. The bias condition obtained through the thermal compensation technique can change dramatically from one ambient temperature to the other, resulting in unpredictable biasing condition in real operation.

On the other hand, despite of the problems mentioned above, the thermal compensation based biasing technique has been adopted in almost all amplifier products since solid state power amplifier is introduced and appeared to be successful for decades. This is because of two reasons which make the biasing issues less profound than it otherwise would be. First, in almost all power output stages, there is an emitter or source degeneration resistor connected in series with the transistor emitter or source node. The use of such a resistor g greatly reduces the equivalent trans-conductance of the combined transistor-resistor circuit hence decrease the sensitivity of the biasing current as related to the biasing voltage, resulting in a higher tolerance of the biasing voltage variation which helps maintaining biasing stability and preventing thermal run-away. The other reason is the application of global negative feedback. Many of the biasing issues and corresponding performance degradation are greatly mitigated by the feedback correction effect along with other imperfections, at least on measurement base. As a matter of fact, the traditional thermal static measurement technique used to measure amplifier distortion and other performances also helps hiding thermal dynamic related problems since the static measurement can't reveal music profile related amplifier dynamic behavior as mentioned before. In fact, the discrepancy between the real dynamic behavior and the statically measured datasheet numbers could be one reason to explain why amplifiers with similar measured distortion performance could sound audibly different.

In fact, biasing techniques without using thermal compensation have also been reported in the past. Most of them tried to use the more reliable and controllable electrical feedback to regulate the biasing. One representative example is the "Novel Quiescent Current Controller" proposed by Douglas Self in his book "Audio Power Amplifier Design Handbook, third edition" from Newnes. A circuit diagram of which is shown in FIG. 2. The idea is to monitor the voltage across the top and bottom emitter/source degeneration resistors and use a feedback loop including the $V_{be}$ multiplier to regulate this summed voltage to be equal to a predefined reference voltage, hence a predefined biasing current will be built on the output stage. However, this approach is only applicable in Class A operation, since once one output transistor turns to cut-off while the other keeps conducting more current when output voltage moves beyond the Class A region, the summed voltage over the two emitter degeneration resistors will keep increasing, resulting in a regulated biasing voltage lower than needed as it tries to keep the summed voltage over the degeneration resistors unchanged. This technique also mandates the use of the emitter/source degeneration resistors, as we will see later, it is not a preferred solution as well. There do exist technologies trying to make the electrical feedback based technology extended for Class AB operation by using complicated triggering and sample and hold circuit in a way that it only monitors the push-pull transistors' current during the zero voltage output moment. However, all these added functions not only increase the circuit complexity, but also bring in extra sources of noise and distortion due to the more rushed circuit status change like comparator flipping and the transistors switching operations, making them less attractive in commercial products.

Back to the conventional counteractions against the thermal compensation related problems, neither the use of degeneration resistor nor the overall feedback is a preferred solution or fashionable design in today's audio power amplifier industry. First, the use of degeneration resistors not only reduces the equivalent trans-conductance of the output transistor hence increases output impedance, resulting in lower damping factor, but also exacerbates the so called "$g_m$-doubling" phenomenon by bringing sharp bumps in the voltage transfer curve in the cross-over region as the insertion of the degeneration resistor disrupts the originally more smoothly conjugated combined trans-conductance of the complimentary transistors when the current conduction is handed over from one type of transistor to the other. The abrupt trans-conductance change in the crossover region simply implies that extra crossover distortions comprised of higher order harmonics are added to the amplifier output. On the other hand, despite of the controversial over the claimed superiority, eliminating or reducing the use of overall feedback is an undeniably prevailing trend among hi-end audio amplifier manufactures and audiophile users. However, by simply removing or reducing the powerful global feedback without taking other counteractions, all the biasing related issues, pairing with the emitter/source degeneration resistor related problems like increased output impedance and extra high order crossover distortions will become serious problems. Therefore, a new biasing technology which can overcome all these problems by its own and applicable on both Class A and Class AB while bring in only reasonable complexity and none or less performance degradation is highly called for.

SUMMARY OF THE INVENTION

The present invention is accomplished with the previously mentioned circumstances in mind. An object of the invention is to provide an accurate and reliable biasing technique able to overcome all the issues associated with the conventional thermal compensation based biasing technology and capable of working on both Class A and Class AB amplifiers at a cost of only reasonably increased complexity.

The proposed biasing technique is built up on pure electrical feedback and only well defined electrical parameters are needed for the design. Thermal coupling and thermal compensation is no longer necessary. By excluding the use of thermal related aspects in the feedback scheme, the biasing quality and performance in almost all aspect is greatly improved.

Compared to other electrical feedback based biasing techniques, this new method devised a unique current summing technique which automatically monitors the output stage upper and lower transistors' current only in the Class A region and stops doing so once the transistors move beyond this region. Because of this, the new method is applicable on both Class A and Class AB amplifiers. In addition, because the current summing is not done directly over the emitter/source degeneration resistors, the use of those resistors are not necessary, greatly increase amplifier performance improvement potential especially when non overall feedback design is in mind.

DESCRIPTION OF THE PREFERRED EMBODIMENTS

Figure 1:
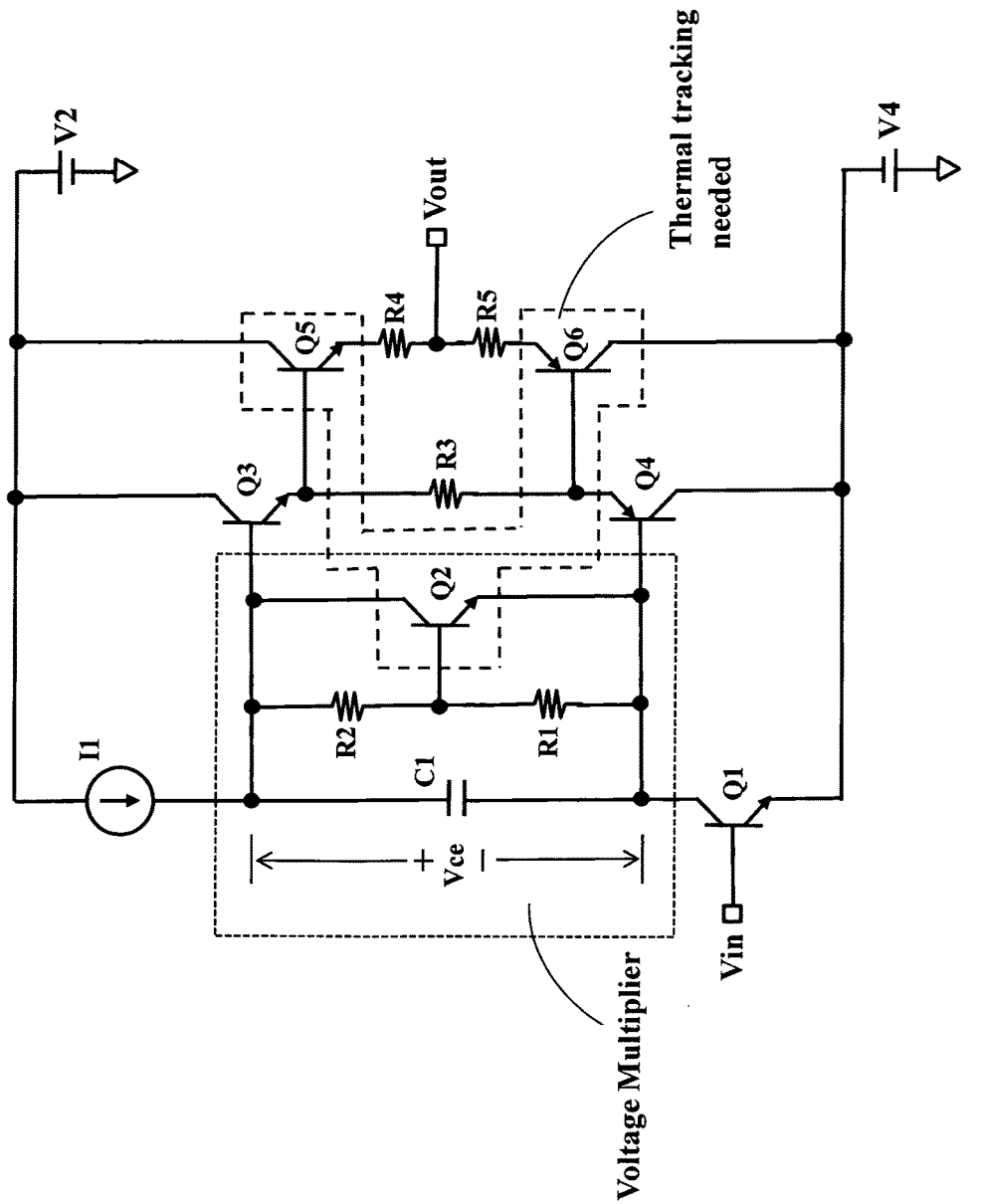
FIG. 1 is a circuit example of prior art about thermo compensation based biasing technique
Figure 2:
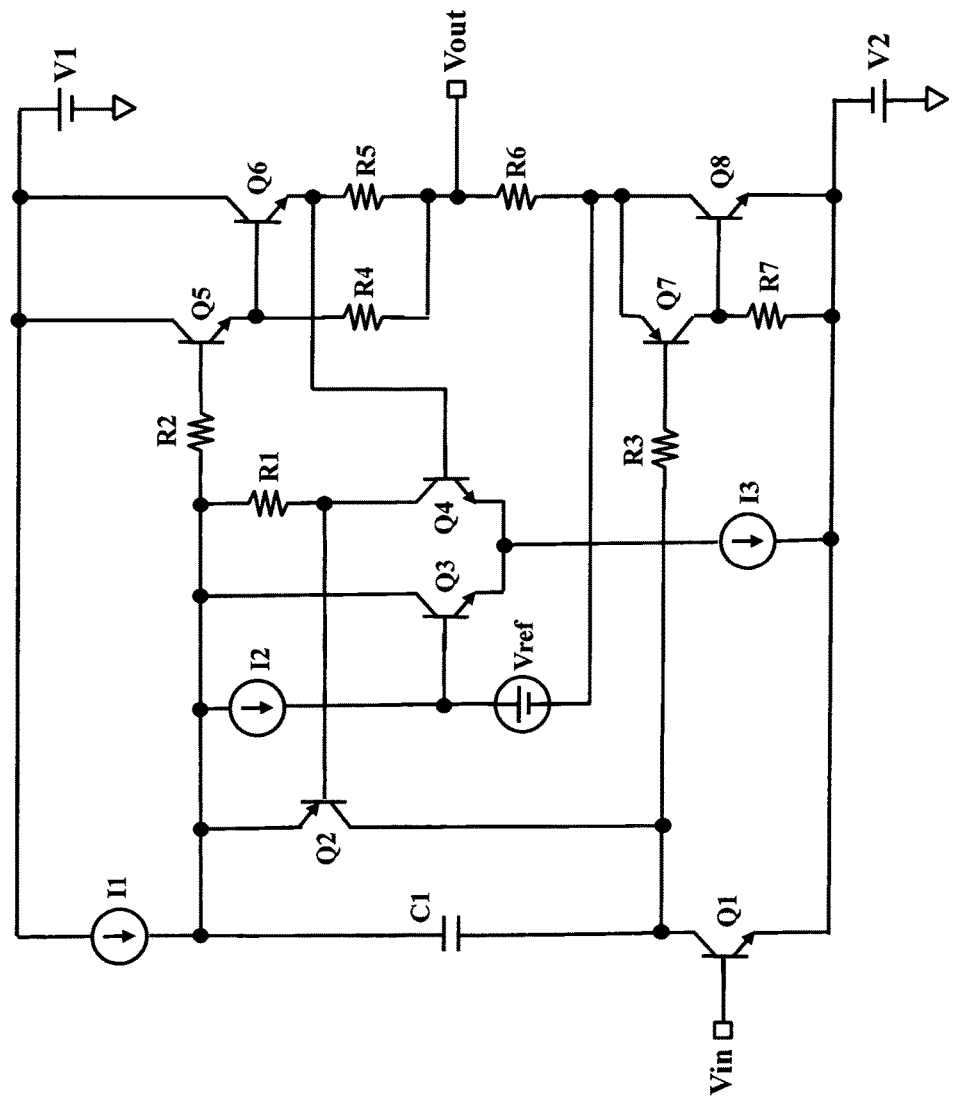
FIG. 2 is a circuit example of prior art about existing electrical feedback based biasing technique
Figure 3:
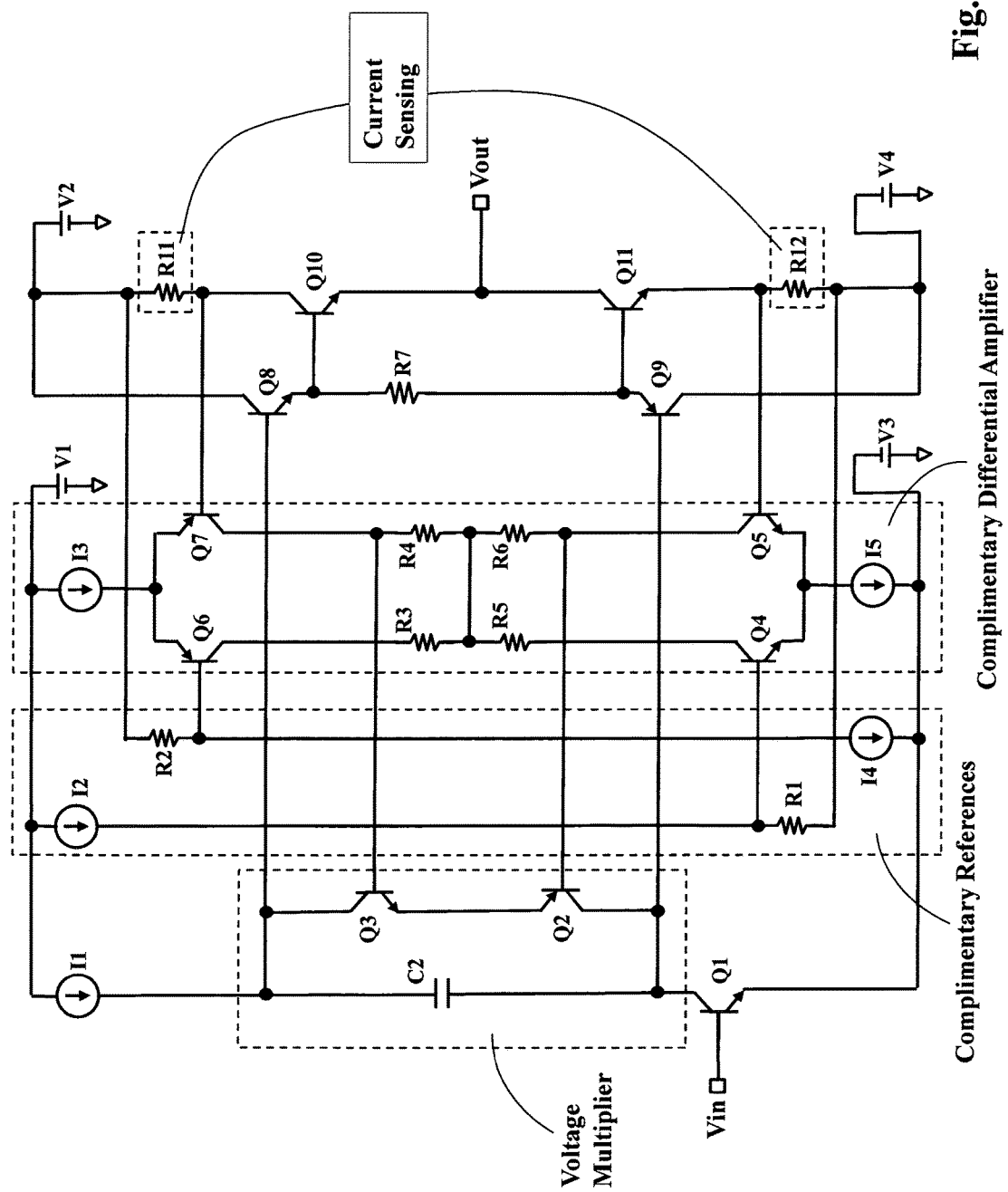
FIG. 3 is a circuit schematic of one embodiment of proposed electrical feedback based biasing technique

An implementation example of the proposed new biasing technique is shown in FIG. 3. The core biasing scheme is comprised of four sub functional circuits: a complimentary output power device current sensing circuit which generates current corresponding voltage outputs and is comprised of R11 and R12; a complimentary differential amplifier which takes the outputs of the current sensing circuit as it's inputs against a complimentary reference voltage pair and is comprised of Q4~Q7, I3, I5, and R3~R6; a complimentary reference generator which creates aforementioned reference voltages for the previously described complimentary differential amplifier and is comprised of I2, I4, R1 and R2; a voltage multiplier which takes the amplified voltage output of the complimentary differential amplifier as it's input and generates the final output voltage to be used as the bias voltage for the output stage and is comprised of Q2, Q3 and C2.

The key uniqueness of the new design is that the complimentary differential amplifier pair is connected in a back-to-back fashion that the otherwise the power supply nodes of the N-type and P-type differential amplifier is tied together and left floating. By doing so the output voltage, the voltage across R4 and R6, can be done in a way that it only tracks the summed current on R11 and R12 for a small dynamic range corresponding to a certain output swing range of the power transistors and stops doing so once the power transistors move beyond this region as signal increases. Since a Class A or Class AB amplifier always has an output range within which the transistors are under Class A operation, as long as this Class A operation region is bigger than the tracking range of the complimentary differential amplifier, the output voltage of the complimentary differential amplifier can then be a good corresponding value of the output stage biasing current, hence a correct biasing voltage will be established for the output stage.

In order to make this happen, the value of R3~R6 should be chosen in a way that when half of I3 or I5 flows in these resistors the voltage drop along R4 and R6 generates the $V_{be}$ voltage needed to conduct a current equal to I1 for Q2 and Q3 at room temperature; or in other words, it should be designed that Q4/Q5 pair conduct equal current on each side under quiescent condition (i.e., when no AC input applied), similarly the same requisite should holds true for Q6/Q7 pair as well.

The details of the desired Class-A-region-only common mode current tracking capability is discussed as below.

Under static condition, let's assume the desired biasing is already established through the feedback regulation mechanism and the complimentary differential pairs are under normal linear operation region since Q4/Q5 and Q6/Q7 pairs are designed with equal current conducting in each path under static condition as mentioned above. Now, assuming a small biasing current deviation occurs in the complimentary power device pair Q10/Q11, for example, in the case when the quiescent current starts increasing due to the heating up of the transistor and the negative temperature coefficient of the BJTs' base-emitter voltage after power-on. This then results in small increased voltage drops across R11 and R12, as this input change is small, the differential amplifier can be assumed still in normal linear amplification region hence resulting in an amplified bigger summed voltage output across R4 and R6. Since this summed voltage is also the input of the voltage multiplier, the multiplier output voltage, which determines the biasing current of the output stage, will decrease and hence counteract against the original quiescent current increasing, resulting in a regulatory function and finally stabilize the biasing.

During a dynamic situation under which a music signal is applied to the amplifier, the output complimentary transistor pair Q10/Q11 will operate in a push-pull manner, the instant current of each transistor moves around their quiescent value in an opposite direction until reaching a point at which one transistor starts shutting off while the other keeps increasing its current, indicating the Class-AB region is surpassed. When the instant current of the power devices Q10/Q11 dramatically changes, the complimentary differential pairs (i.e., Q4/Q5 and Q6/Q7) will stay on balanced condition only for the moment when output voltage resides in the close vicinity of its midpoint corresponding to zero input and enter un-balanced condition for most of the time due to the open loop essence of the circuit topology in terms of differential mode reaction. This is because, when small differential current component occurs between Q10 and Q11 and assuming a plus (i.e., increasing) current in Q10 and a minus (i.e., decreasing) current in Q11, the Q6/Q7 pair will generate a increased voltage drop on R4, and Q4/Q5 pair will generate a decreased voltage drop on R6. To the first order, this opposite voltage changes will cancel with each other and result in unchanged summed voltage across R4 and R6, hence no feedback reaction will take effect in terms of bias voltage/current regulation. Consequently, no feedback induced counteraction will take effect as well in terms of forcing the inputs of the differential pairs to approach the equalized situation as it does with common mode disturbances. Therefore, as the differential current instant increases and reaches a meaningful value, the relatively big open loop gain of the differential pairs will make the circuit enter unbalanced mode at which one path conducts the whole biasing current (i.e., I3 or I5) while the other path is completely shut-off. Under this unbalance condition, the summed voltage across R4 and R6 is still unchanged (to the first order) since the voltage drop across one resistor (i.e., R4 or R6) equals to the whole nominal value while the other is zero.

Figure 4:
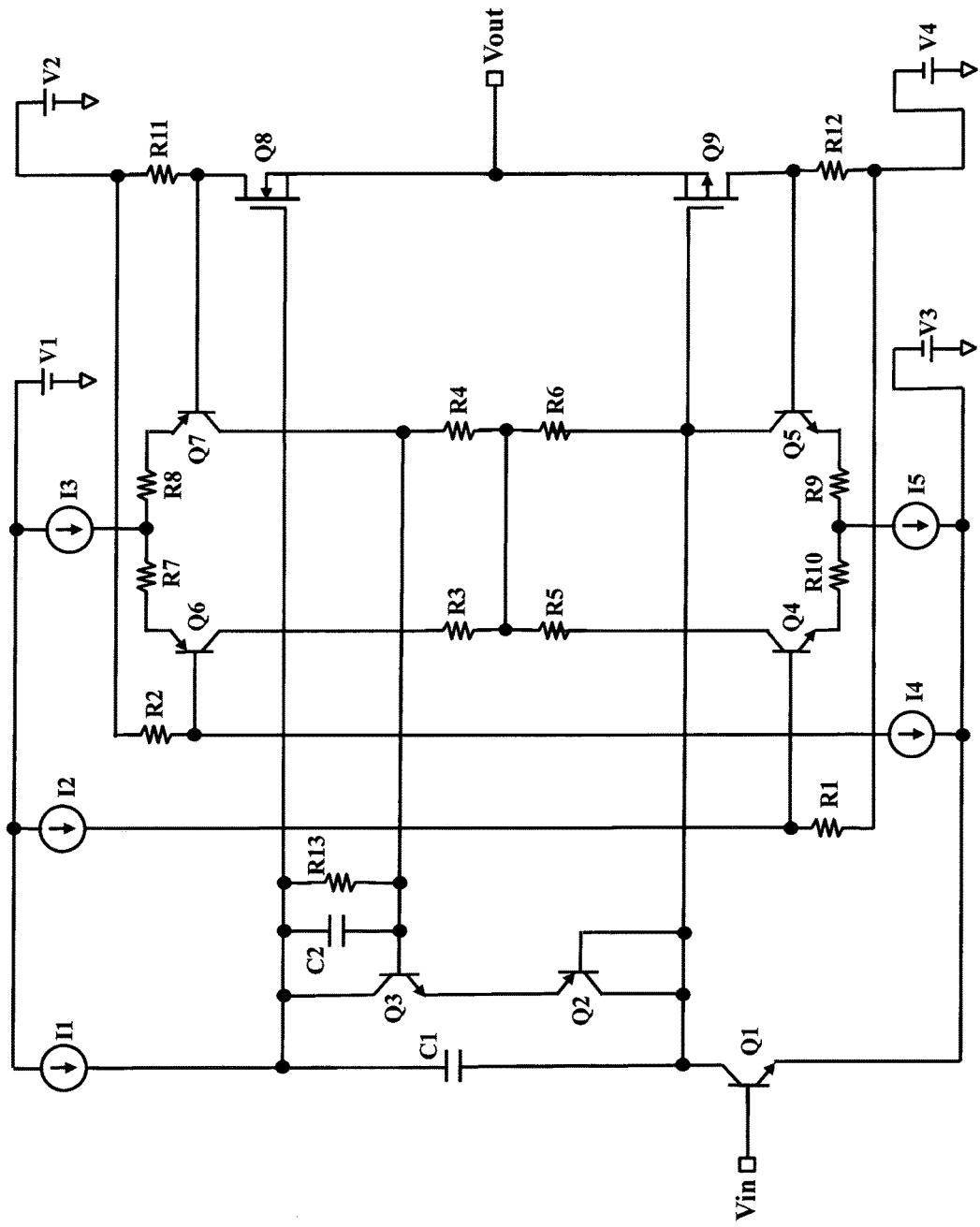
FIG. 4 is a circuit schematic of another embodiment of proposed electrical feedback based biasing technique

Another implementation example of the proposed new biasing technique is shown in FIG. 4. This is in essential the same as the example mentioned above. The main difference between this and the previous one is the diode connection of the lower amplification transistor Q2 in the voltage multiplier and the adding of emitter degeneration resistors in the complimentary differential amplifier pair. The diode connection of Q2 helps simplifying the Vce balance if it is constructed as a amplification device as done in the previously mentioned embodiment as shown in FIG. 6. The addition of emitter degeneration resistor in the complimentary differential amplifier pair is to reduce the gain of the circuit to reduce potential common mode related interference to the signal amplification performance. Another change in this embodiment is the use of MOSFET in the output stage.

One more implementation of the proposed new biasing technique is that the current sensing resistors used in previous embodiments as denoted as R11, R12, R1 and R2 are replaced with diode connected transistors. The reason for this is to mitigate the tracking errors as the summed current of the push-pull transistors even under Class A region is not constant if a constant biasing voltage is applied. By using these diode connected transistors the non-linearity of the current-to-voltage conversion can cancel that of the output transistors, hence resulting in more stable biasing especially for Class A operation.

What is claimed is:

1. A biasing circuit which provides biasing voltage for typical solid state output stage formed by complimentary Emitter Follower (hereinafter EF), complimentary Source Follower (hereinafter SF), or Complimentary Feedback Pair (hereinafter CFP), in an audio frequency power amplifier to establish stable biasing current comprising:

a current sensing circuit which tracks the instantaneous conducting current in the complimentary power devices of said complimentary output stage and generates a complimentary voltage output pair with each voltage value corresponding to said output device current under tracking, respectively; wherein and hereinafter said complimentary device or voltage pair refers to the conjugative device pair of N and P type semiconductor devices or the conjugative voltage pair with one related to N type device and the other related to P type device, respectively;

a complimentary voltage reference generator which generates a complimentary reference voltage pair which pairs with aforementioned complimentary voltage output pair to form a complimentary differential voltage pair to be used as the input of the complimentary differential amplifier mentioned hereinafter, a complimentary differential amplifier which takes aforementioned complimentary differential voltage pair as its input and generates an amplified differential output voltage which is only sensitive and related to the quiescent biasing current despite of the instant operation condition of the output transistor devices; wherein said complimentary differential amplifier contains only one amplification stage and said differential output voltage directly forms the input to the voltage multiplier mentioned hereinafter;

a voltage multiplier which takes said voltage output of aforementioned complimentary differential amplifier as its input and generates an amplified output voltage which forms the biasing voltage and hence determines the quiescent biasing current of aforementioned complimentary output stage devices;

a negative feedback scheme/loop which is formed through the connection of aforementioned current-to-voltage conversion circuit, complimentary reference voltage pair, complimentary differential amplifier, voltage multiplier and output devices; through which a desired quiescent biasing current is established and maintained in said complimentary output devices; wherein said feedback scheme/loop is constructed as described in following: said complimentary voltage output pair of said current sensing circuit and said complimentary reference voltage pair of said complimentary voltage reference generator form a complimentary differential input voltage pair which is connected to said input nodes of said complimentary differential amplifier; said differential output voltage nodes of said complimentary differential amplifier are connected to said input nodes of said voltage multiplier; said output nodes of said voltage multiplier are connected to the input nodes of said complimentary output power stage; through the formation of said feedback scheme/loop, the polarity of each connection is constructed in a way that only a negative (other than positive) feedback is formed within the entire loop when quiescent biasing current on output stage is considered as the variable in the feedback system.

2. A biasing circuit as recited in claim 1, wherein said current sensing circuit is a diode-connected configuration of a transistor device with the same type and polarity as that of said output device(s) under monitoring; wherein said diode-connected configuration refers to connecting the base and collector terminals together for a Bipolar Junction Transistor (BJT) or connecting the gate and drain terminals together for a Field Effect Transistor (FET) and converting the device into a two terminal device with a diode like current-to-voltage transfer characteristics; wherein said output voltage is hence the voltage across said diode-connected two terminal device.

3. A biasing circuit as recited in claim 1, wherein said complimentary voltage reference generator is a circuit which generates a complimentary voltage pair with each voltage component corresponding to that of said complimentary voltage output pair generated by aforementioned current sensing circuit; wherein said voltage component value is fixed and is equal to that of said complimentary output voltage pair of current sensing circuit when desired quiescent biasing current is established in output stage; wherein said voltage reference generator is comprised of a current source and a two-terminal current-to-voltage conversion device; wherein said current source provides a fixed current which flows through said two-terminal current-to-voltage conversion device and generates aforementioned voltage reference across it; wherein said two-terminal current-to-voltage conversion device is a diode-connected configuration of a transistor device with the same type and polarity as that of said corresponding power device(s) in output stage; wherein said diode-connected configuration refers to connecting the base and collector terminals together for a Bipolar Junction Transistor (BJT) or connecting the gate and drain terminals together for a Field Effect Transistor (FET) and converting the device into a two terminal device with a diode like current-to-voltage transfer characteristics; wherein said voltage reference is hence the voltage across said diode-connected two terminal device.

4. A biasing circuit as recited in claim 3, wherein said two-terminal current-to-voltage conversion device is a combination of a resistor and a diode-connected transistor; wherein said resistor and diode-connected transistor is connected in series and the two end terminals form the two nodes of said combined two-terminal device; wherein said diode-connection refers to the same circuit construction as described in claim 3.

5. A biasing circuit as recited in claim 1, wherein said complimentary differential amplifier is comprised of one N type differential pair amplifier and one P type differential pair amplifier; wherein said N type differential pair amplifier is comprised of a pair of N type transistors, a current source and a pair of load resistor; wherein said pair of N type transistors is configured as a common emitter differential amplifier if Bipolar Junction Transistors (hereafter denoted as BJT) are used or as a common source differential amplifier if Field Effect Transistors (hereafter denoted as FET) are used and has the two emitter or the source nodes connected to said current source and form a joint emitter or source node, respectively; wherein each of said load resistor pair is connected between each transistor output node, i.e., the collector node if BJT is used or drain node if FET is used, and a common floating rail, respectively; wherein the two transistor input nodes, i.e., the base nodes if BJTs are used or gate nodes if FETs are used, form the differential input nodes of said N type differential pair amplifier; wherein the output node of the transistor which has its input connected to said voltage output of said current sensing circuit forms one output node of said complimentary differential amplifier; similarly, said P type differential pair amplifier is comprised of a pair of P type transistors, a current source and a pair of load resistor, wherein said pair of P type transistors is configured as a common emitter differential amplifier if BJTs are used or as a common source differential amplifier if FETs are used and has the two emitter or the source nodes connected to said current source and form a joint emitter or source node, respectively; wherein each of said load resistor pair is connected between each transistor output node, i.e., the collector node if BJT is used or drain node if FET is used, and said common floating rail, respectively; wherein the two transistor input nodes, i.e., the base nodes if BJTs are used or gate nodes if FETs are used, form the differential input nodes of said P type differential pair amplifier; wherein the output node of the transistor which has its input connected to said voltage output of said current sensing circuit forms the other output node of said complimentary differential amplifier; wherein said common floating rail is the common connection node of said 4 load resistors and is not connect to a reference voltage or power supply.

6. A biasing circuit as recited in claim 5, wherein said N and P type differential pair amplifiers are emitter degenerated (if BJTs are used) or source degenerated (if FETs are used), i.e., each said transistor has a resistor inserted between its emitter or source node and said joint current source node, respectively.

7. A biasing circuit as recited in claim 5, wherein the two resistors among said four load resistors which are not connected to said output nodes of said complimentary differential amplifier are omitted, i.e., replaced with two strait wires, respectively.

8. A biasing circuit as recited in claim 5, wherein a capacitor is connected in parallel with each load resistor.

9. A biasing circuit as recited in claim 1, wherein said voltage multiplier is comprised of a complimentary pair of common emitter single ended amplifier if BJT transistors are used or common source single ended amplifier if FETs are used; wherein the N type common emitter/source single ended amplifier and the P type common emitter/source single ended amplifier of said complimentary pair are connected in series and symmetrically by tying the emitter/source nodes together; wherein the base/gate nodes of said complimentary single ended amplifiers form a complimentary input node pair to be connected to said output nodes of said complimentary differential amplifier; wherein the voltage between the collector/drain nodes of said N/P type complimentary transistors forms said output voltage which is applied to the input of said complimentary output stage to establish desired biasing current.

10. A biasing circuit as recited in claim 9, wherein a local feedback resistor is inserted between said input and output node of each single ended amplifier of said voltage multiplier.

11. A biasing circuit as recited in claim 9, wherein a local feedback capacitor is inserted between said input and said output node of each single ended amplifier of said voltage multiplier.

12. A biasing circuit as recited in claim 9, wherein one of said complimentary single ended amplifier pair is replaced with a diode-connected transistor circuit; wherein said diode connection refers to the same circuit construction as described in claim 2; wherein the shorted node of base/gate and collector/drain nodes forms both input and output node of the single ended amplifier corresponding to said single ended amplifier replaced with diode-connected transistor of said voltage multiplier.

13. A biasing circuit as recited in claim 12, wherein said diode-connected transistor circuit is replaced with a straight wire.

* * * * *